United States Patent [19]

Kwa

[11] Patent Number: 4,989,214
[45] Date of Patent: Jan. 29, 1991

[54] LASER DIODE, METHOD FOR MAKING DEVICE AND METHOD FOR MONITORING PERFORMANCE OF LASER DIODE

[75] Inventor: Peter T. H. Kwa, Kanata, Canada

[73] Assignee: Northern Telecom Limited, Montreal, Canada

[21] Appl. No.: 522,015

[22] Filed: May 11, 1990

[51] Int. Cl.$^5$ ............................................. H01S 3/19
[52] U.S. Cl. ..................................... 372/50; 372/33; 372/38
[58] Field of Search ..................... 372/50, 33, 38, 44; 250/393, 552, 206; 357/19; 350/96.11

[56] References Cited

U.S. PATENT DOCUMENTS

| | | | |
|---|---|---|---|
| 4,470,143 | 9/1984 | Kitamura et al. | 372/50 |
| 4,558,449 | 12/1985 | Gordon | 372/44 |
| 4,675,518 | 6/1987 | Oimura et al. | 250/205 |
| 4,713,819 | 12/1987 | Yoshikawa | 372/9 |
| 4,773,074 | 9/1988 | Hunsperger et al. | 372/50 |
| 4,811,350 | 3/1989 | Yamamoto et al. | 372/43 |

OTHER PUBLICATIONS

"Characteristics of 1.3 μm InGaAsP Lasers Used as Photodetectors", Van Der Ziel, Journal of Lightwave Technology, vol. 7, No. 2, Feb. 1989, pp. 347–352.

Primary Examiner—Frank Gonzalez
Assistant Examiner—Galen J. Hansen
Attorney, Agent, or Firm—C. W. Junkin

[57] ABSTRACT

A monolithically integrated structure comprises a laser diode, a photodetector diode and a reference diode which are monolithically integrated on a common substrate. The photodetector diode is optically coupled to the laser diode. The reference diode is substantially identical to the photodetector diode and optically decoupled from the laser diode. When substantially equal reverse biases are applied to the photodetector diode and the reference diode, the reference diode conducts a leakage current which can be used to substantially cancel the leakage current of the photodetector diode. The monolithically integrated structure may also include a modulator diode which is monolithically integrated on the common substrate and optically coupled to the laser diode. The monolithically integrated structure is useful in optical communications systems.

15 Claims, 5 Drawing Sheets

LASER DIODE, METHOD FOR MAKING DEVICE AND METHOD FOR MONITORING PERFORMANCE OF LASER DIODE

Field of the Invention

This invention relates to laser diodes, to methods for making laser diodes and to methods for monitoring the performance of laser diodes.

Background of the Invention

Laser diodes used for optical communications have two end facets which define an optical cavity within which light amplification by stimulated emission occurs. Light is emitted from both of these facets.

Generally, light emitted from one facet is coupled into an optical fiber to transmit an optical signal along the fiber, and light emitted from the other facet is coupled into a photodetector diode (or back facet monitor) which monitors the operation of the laser. An output signal of the photodetector diode may be applied to control circuitry which controls the operation of the laser. Alternatively or additionally, the output signal of the photodetector diode may be applied to maintenance circuitry which generates an appropriate indication and takes the laser diode out of service if the laser diode is not operating properly.

Conventionally, the laser diode and the photodetector diode have different structures, each structure being optimized for its particular function. The two different structures are separately fabricated on distinct semiconductor substrates and secured to a common hybrid substrate. The laser diode and the photodetector diode must be carefully aligned before they are secured to the common substrate to ensure that light emitted from one facet of the laser diode is efficiently coupled into the photodetector diode.

Conventional semiconductor laser diodes comprise a series of semiconductor layers which include a doping junction. To operate the laser diode as a laser, the doping junction is forward biased. It has been recognized that a laser diode can be operated as a photodetector diode if the doping junction is reverse biased (van der Ziel, Journal of Lightwave Technology, Vol. 7, No. 2, February 1989; U.S. Pat. No. 4,773,074 issued Sept. 20, 1988, in the names of R. G. Hunsperger and J. H. Park).

Unfortunately, conventional laser diodes have poor responsivity and are relatively slow when operated as photodetectors unless they are appropriately reverse biased. Moreover, if conventional laser diodes are reverse biased to operate as photodetectors with acceptable sensitivity and speed, they have large leakage currents. Such leakage currents are superimposed on the photocurrent, so that the total photocurrent does not give an accurate measure of the optical power emitted from the laser. It is difficult to compensate for these leakage currents because they are highly dependent on the operating temperature and the reverse bias, both of which may vary from device to device and may drift during the operation of any one device. Laser diode structures which provide better photodetector operation have been proposed, but the design features which improve the performance of such structures as photodetectors degrade their performance as lasers.

SUMMARY OF THE INVENTION

This invention seeks to avoid the need for careful alignment of a laser diode and a back facet monitoring photodetector diode on a hybrid substrate by providing a laser diode and a back facet monitoring photodetector diode which are monolithographically integrated on a common substrate. An unilluminated reference diode which is substantially identical to the photodetector diode is monolithically integrated on the same semiconductor substrate.

To simplify the integration, the laser diode, the photodetector diode and the reference diode may comprise an identical series of semiconductor layers and may be separated by grooves. A groove which separates the laser diode from the photodetector diode may define a back facet of the laser diode. Substantially equal reverse biases may be applied to the photodetector diode and the reference diode so that the reference diode provides a current which substantially cancels the leakage current of the photodetector diode.

Thus, one aspect of the invention provides a monolithically integrated structure comprising a laser diode, a photodetector diode and a reference diode monolithically integrated on a common substrate. The photodetector diode is optically coupled to the laser diode. The reference diode is substantially identical to the photodetector diode and is optically decoupled from the laser diode.

Each of the laser diode, the photodetector diode and the reference diode may comprise an identical series of epitaxial semiconductor layers. The laser diode, the photodetector diode and the reference diode may be separated by grooves which extend through the epitaxial layers to the substrate. A groove which separates the laser diode from the photodetector diode may define a back facet of the laser diode.

The substrate may be a semiconducting substrate, and the laser diode, the photodetector diode and the reference diode may have a common electrical contact to the substrate. Alternatively, the substrate may be a semiinsulating or monocrystalline insulating substrate, and the laser diode, the photodetector diode and the reference diode may be electrically isolated from one another.

The monolithically integrated structure may further comprise a modulator diode which is monolithically integrated on the common substrate and optically coupled to the laser diode.

Another aspect of the invention provides a method for making a monolithically integrated structure comprising a laser diode, a photodetector diode and a reference diode which are monolithically integrated on a common substrate. The method comprises forming a plurality of epitaxial semiconductor layers on a substrate; forming grooves which extend through the epitaxial layers to the substrate to separate the epitaxial layers into a laser diode, a photodetector diode and a reference diode; and forming electrical contacts to the laser diode, the photodetector diode and the reference diode.

Another aspect of the invention provides a method for monitoring the performance of a laser diode having a monolithically integrated photodetector diode optically coupled thereto and a monolithically integrated reference diode optically decoupled therefrom. The method comprises applying substantially the same reverse bias to the photodetector diode and the reference diode; detecting a first current in the photodetector diode, that first current being the sum of a photocurrent and a leakage current; detecting a second current in the reference diode, that second current being a leakage current; and subtracting a signal proportional to the second current from a signal proportional to the first current to derive a signal proportional to the photocurrent.

BRIEF DESCRIPTION OF THE DRAWINGS

Embodiments of the invention are described below by way of example only. Reference is made to accompanying drawings in which.

DETAILED DESCRIPTION OF EMBODIMENTS

Figure 1A:
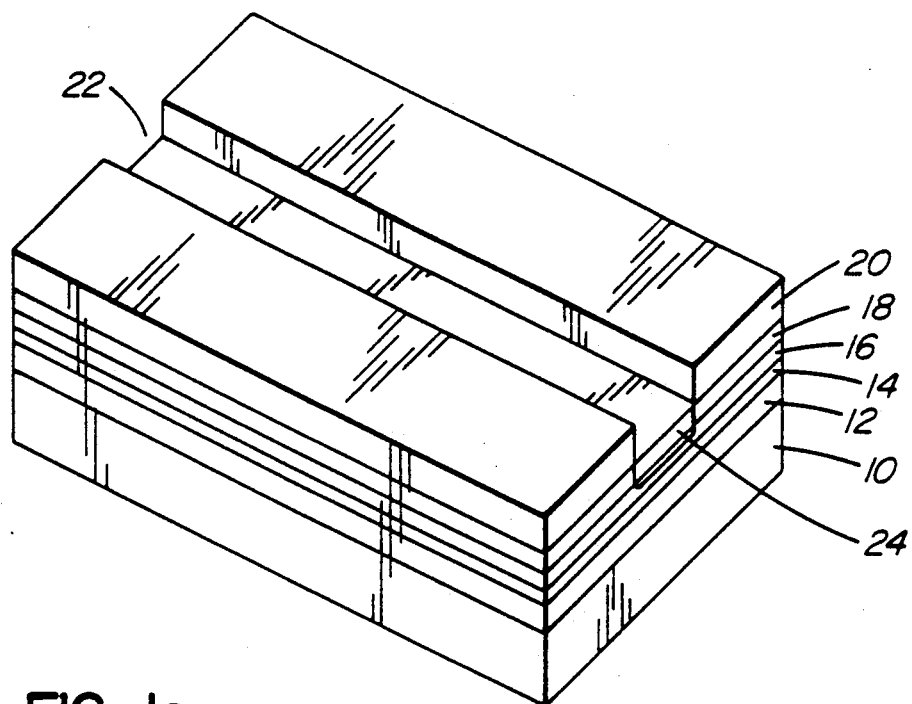
FIGS. 1a-1c are perspective views of a monolithically integrated structure at successive stages of its fabrication.
Figure 1B:
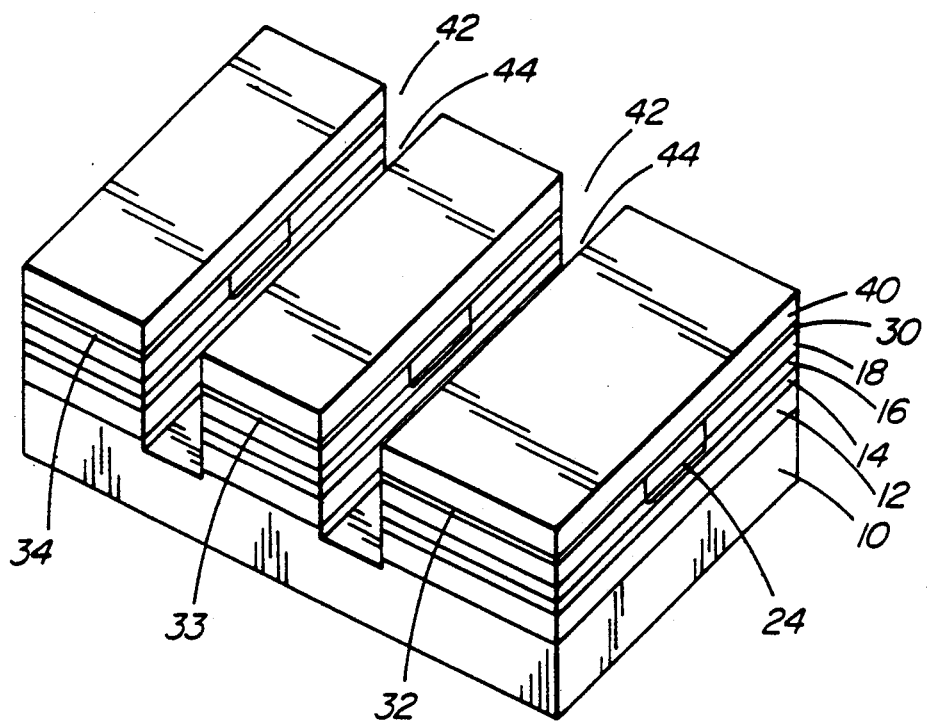
Figure 1C:
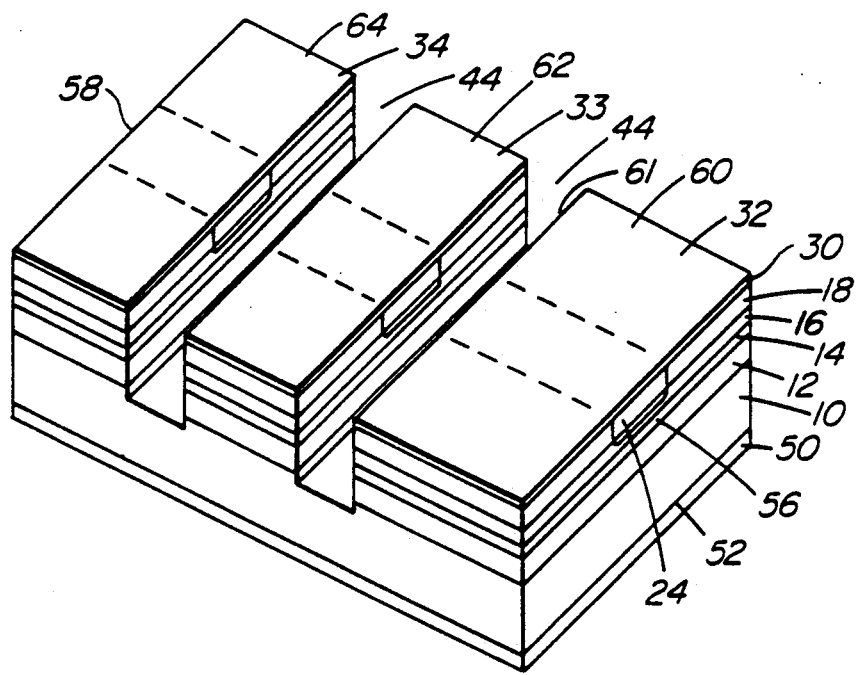

FIGS. 1a-1c illustrate a method for making a monolithically integrated structure according to an embodiment of the invention.

In the illustrated method, an n-type AlGaAs confining layer 12 is epitaxially grown on an n-type GaAs substrate 10. A p-type GaAs active layer 14 is epitaxially grown on the n-type confining layer 12, and a p-type AlGaAs confining layer 16 is epitaxially grown on the active layer 14. An n-type GaAs capping layer 18 is epitaxially grown on the p-type confining layer 16. A layer 20 of photoresist is deposited on the capping layer 18 and patterned to define an elongate opening 22 through the photoresist layer 20. Zinc is diffused through the opening 22 into the capping layer 18 to define an elongate p-type doped well 24 which extends through the capping layer 18 to the p-type confining layer 16. The resulting structure is shown in FIG. 1a.

The layer 20 of photoresist is stripped from the capping layer 18. A layer 30 of contact metal is deposited on the capping layer 18 and patterned using standard lift off techniques to form three ohmic contacts 32, 33, 34 to the elongate doped well 24. Another layer 40 of photoresist is deposited on the layer 30 of contact metal and patterned to define a pair of elongate openings 42 through the photoresist layer 40. Each of the elongate openings 42 is oriented perpendicular to the elongate doped well 24 and located between adjacent ohmic contacts 32, 33, 34. The epitaxial layers 12, 14, 16, 18 are reactive ion etched through the openings 42 to define a pair of grooves 44 which extend through the epitaxial layers 12, 14, 16, 18 to the substrate 10. A $CH_4/H_2$ gas mixture may be used for the reactive ion etching of the grooves 44. The resulting structure is shown in FIG. 1b.

A layer 50 of contact metal is then deposited on a rear face 52 of the substrate 10 and end facets 56, 58 are cleaved to complete the monolithically integrated structure as shown in FIG. 1c.

The completed structure comprises a laser diode 60, a photodetector diode 62 and a reference diode 64 which are monolithically integrated on a common substrate 10. Each of the laser diode 60, the photodetector diode 62 and the reference diode 64 comprises an identical series of epitaxial semiconductor layers 12, 14, 16, 18. The laser diode 60, the photodetector diode 62 and the reference diode 64 are separated by the grooves 44, one of which defines a back facet 61 of the laser diode 60. The photodetector diode 62 is optically coupled to the laser diode 60 via the back facet 61 of the laser diode 60. The reference diode 64 is substantially identical to the photodetector diode 62, and is optically decoupled from the laser diode 60. The layer 30 of contact metal on the capping layer 18 defines distinct upper electrical contacts 32, 33, 34 of the laser diode 60, the photodetector diode 62 and the reference diode 64. The upper electrical contacts 32, 33, 34 are separated by the grooves 44. The layer 50 of contact metal on the rear face 52 of the substrate 10 defines a common lower electrical contact to the substrate 10.

Figure 2:
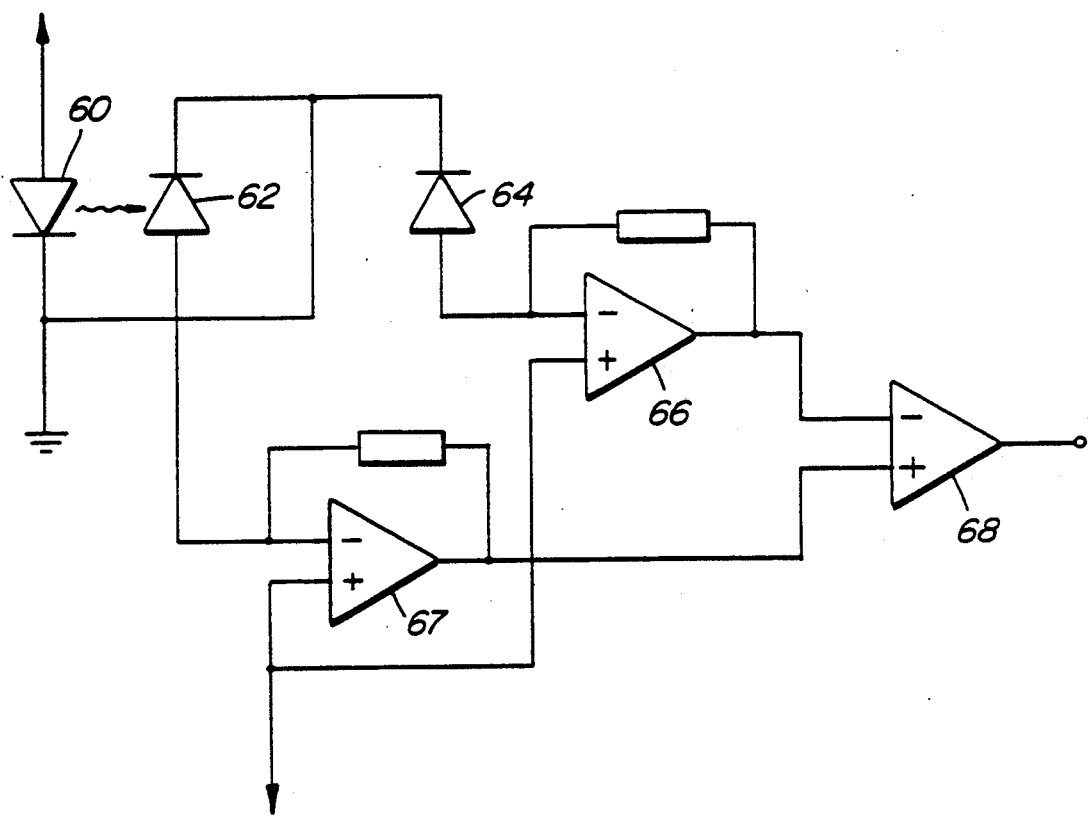
FIG. 2 is a circuit diagram showing a monitoring circuit including the integrated structure of FIG. 1c.

FIG. 2 is a circuit diagram showing an implementation of a method for monitoring the performance of the laser diode 60 using the monolithically integrated photodetector diode 62 and the reference diode 64. The laser diode 60 is forward biased by connecting a positive supply voltage to its upper electrical contact 32 and grounding the common lower electrical contact 50. The upper electrical contacts 33, 34 of the photodetector diode 62 and the reference diode 64 are connected in parallel to inverting inputs of substantially identical feedback amplifiers 66, 67. Each of the feedback amplifiers 66, 67 has a non-inverting input which is connected to a common negative supply voltage, so that substantially the same reverse bias is applied to the photodetector diode 62 and the reference diode 64. Outputs of the feedback amplifiers 66, 67 are coupled to a difference amplifier 68.

The feedback amplifier 67 which is connected to the photodetector diode 62 detects a current in the photodetector diode 62. That current is the sum of a photocurrent generated by light coupled from the back facet 52 of the laser diode 60 to the photodetector diode 62 and a leakage current which would flow in the photodetector diode 62 at that reverse bias even if no light were coupled from the laser diode 60 to the photodetector diode 62. The feedback amplifier 66 which is connected to the reference diode 64 detects a leakage current in the reference diode 64. Because the reference diode 64 is optically decoupled from the laser diode 60, no photocurrent should flow in the reference diode 64. Because the reference diode 64 is substantially identical to the photodetector diode 62, is thermally coupled to the photodetector diode 62 and is subject to substantially the same reverse bias as the photodetector diode 62, the current flowing in the reference diode 64 should be substantially equal to the leakage current flowing in the photodetector diode 62. Consequently, the output of the difference amplifier 68 should be proportional to the photocurrent flowing in the photodetector diode 62 and should therefore provide an accurate indication of the output of the laser diode 60.

Figure 3A:
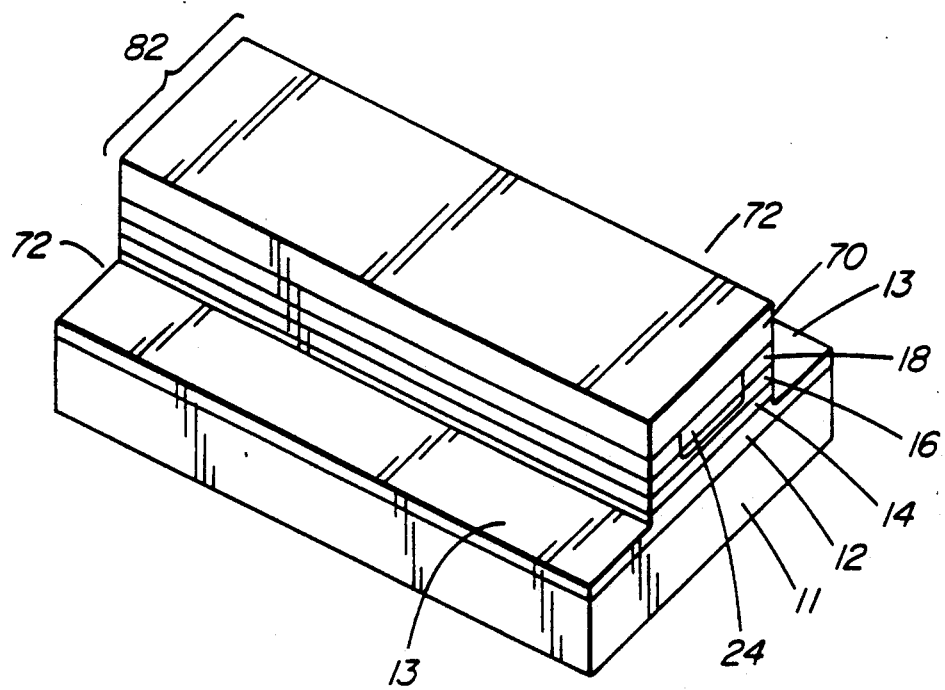
FIGS. 3a-3c are perspective views of another monolithically integrated structure at successive stages of its fabrication.
Figure 3B:
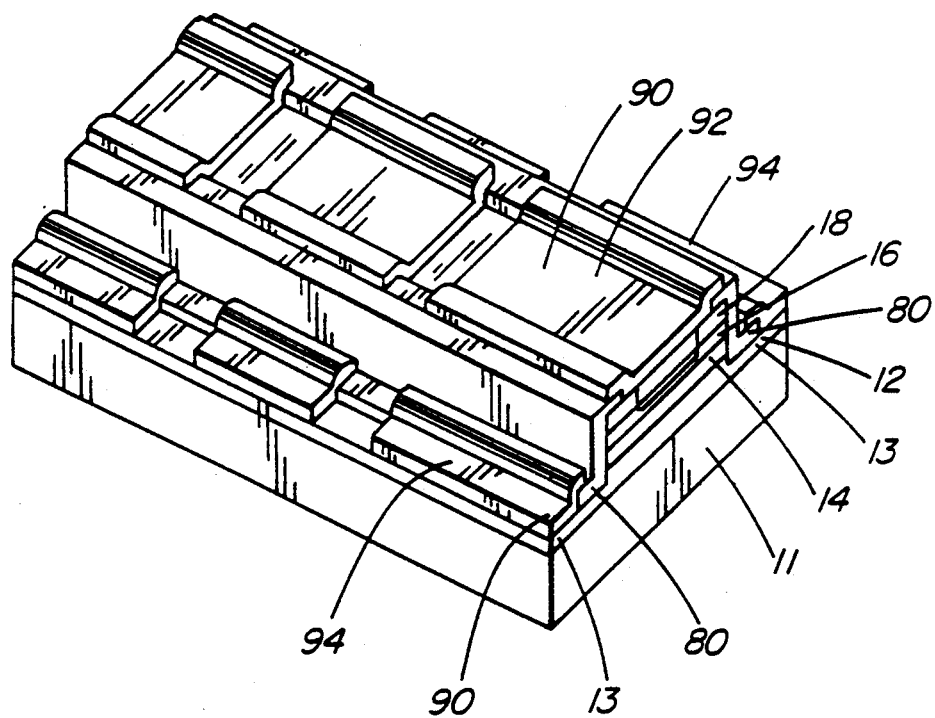
Figure 3C:
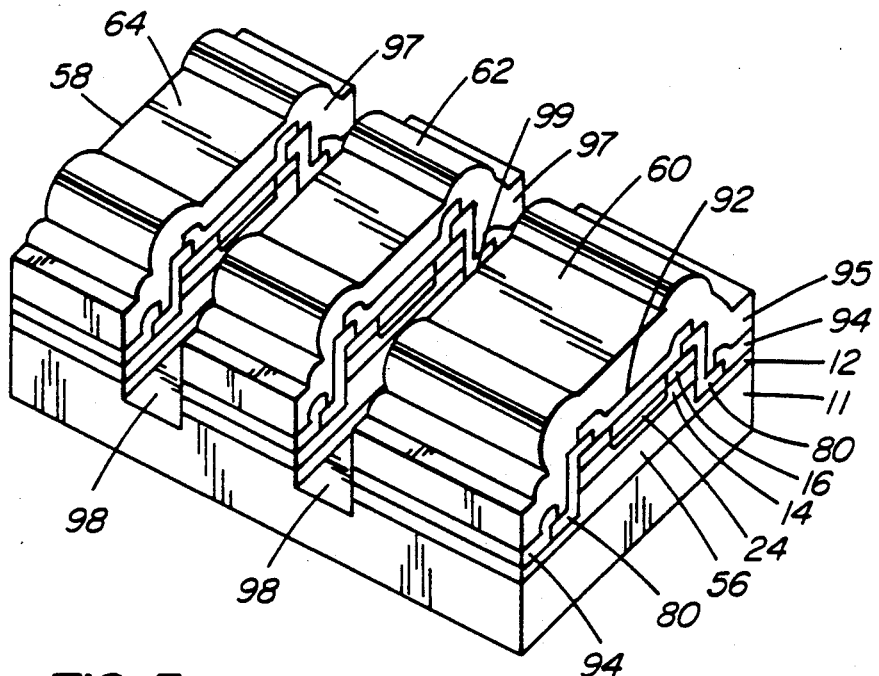
Figure 4:
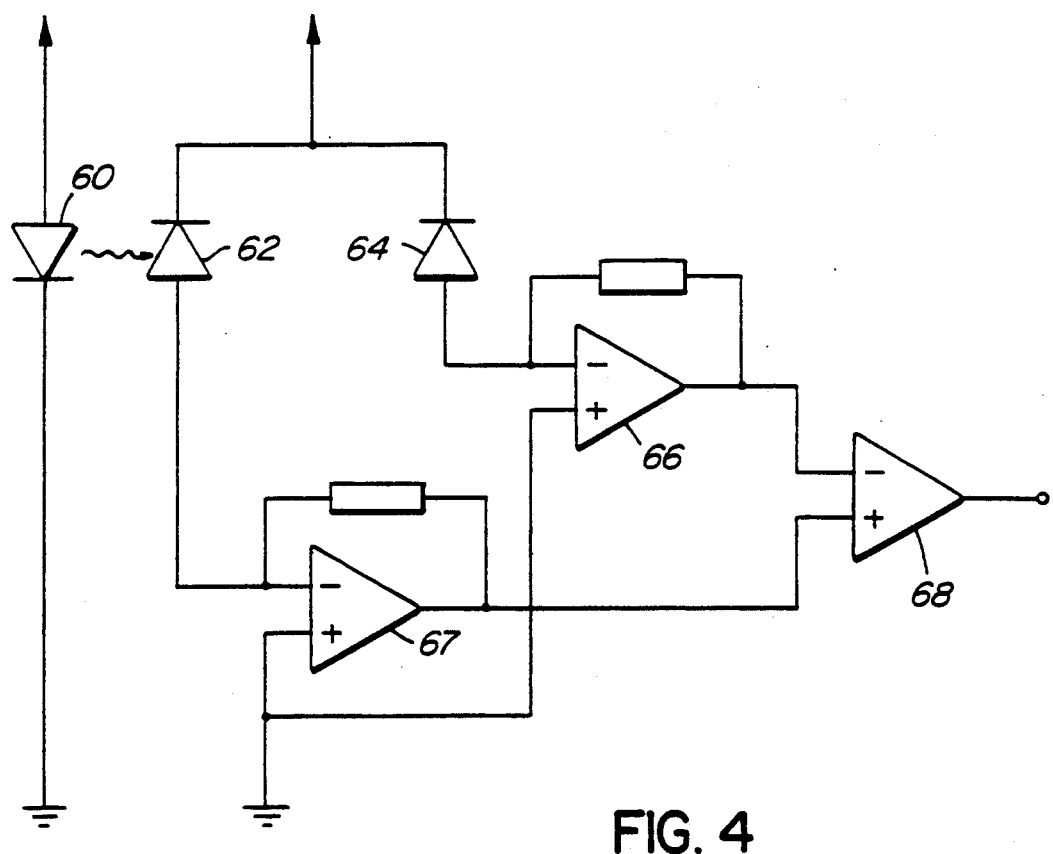
FIG. 4 is a circuit diagram showing a monitoring circuit including the integrated structure of FIG. 3c.

One disadvantage of the integrated structure shown in FIG. 1c and the associated monitoring circuit shown in FIG. 2 is that three reference voltage levels are required for operation of the monitoring circuit. In FIG. 2, for example, a positive supply and negative supply and a ground are required. FIGS. 3a-3c illustrate a method for making an integrated structure which can be used in a monitoring circuit which requires only two reference voltage levels. The monitoring circuit is shown in FIG. 4.

In the method illustrated in FIGS. 3a-3c, a structure similar to the structure illustrated in FIG. 1a is made on a semi-insulating GaAs substrate 11. The layer 20 of photoresist is stripped and another layer 70 of photoresist is deposited on the capping layer 18. The photoresist layer 70 is patterned to define elongate openings 72 through the photoresist layer 70 which are parallel to and laterally spaced from the elongate doped well 24. The epitaxial layers 12, 14, 16, 18 are reactive ion etched through these openings 72 to expose elongate portions 13 of the n-type confining layer 12. The resulting structure is shown in FIG. 3a. The layer 70 of photoresist is then stripped.

An insulating layer 80, such as a layer of silicon dioxide or silicon nitride, is conformally deposited on the structure of FIG. 3a. The insulating layer 80 is photolithographically patterned to define elongate openings 82 through the insulating layer 80 to expose the elongate doped well 24 and the elongate portions 13 of the n-type confining layer 12. A layer 90 of contact metal is conformally deposited on the remaining insulating layer 80 and the exposed doped well 24 and n-type confining layer 13. The layer 90 of contact metal is photolithographically patterned by lift off or other standard techniques to define distinct electrical contacts 92, 94 to the doped well 24 and the n-type confining layer 12. The resulting structure is shown in FIG. 3b.

A layer 95 of photoresist is deposited on the structure of FIG. 3b and patterned to define a pair of elongate openings 97 through the photoresist layer 95. Each of the elongate openings 97 is oriented perpendicular to the elongate doped well 24. The epitaxial layers 12, 14, 16, 18 are reactive ion etched through the openings 97 to define a pair of grooves 98 which extend through the epitaxial layers 12, 14, 16, 18 to the substrate 11. The resulting structure is shown in FIG. 3c. The photoresist layer 95 is stripped to expose the contact metal layer 80, and end facets 56, 58 are cleaved.

The completed structure comprises a laser diode 60, a photodetector diode 62 and a reference diode 64 which are monolithically integrated on a common substrate 11. Each of the laser diode 60, the photodetector diode 62 and the reference diode 64 comprises an identical series of epitaxial semiconductor layers 12, 14, 16, 18. The laser diode 60, the photodetector diode 62 and the reference diode 64 are separated by the grooves 98, one of which defines a back facet 99 of the laser diode 60. The photodetector diode 62 is optically coupled to the laser diode 60 via the back facet 99 of the laser diode 60. The reference diode 64 is substantially identical to the photodetector diode 62, and is optically decoupled from the laser diode 60. The layer 90 of contact metal on the capping layer 18 defines distinct upper electrical contacts of the laser diode 60, the photodetector diode 62 and the reference diode 64. The layer 90 of contact metal on the n-type confining layer 12 defines distinct lower contacts of the laser diode 60, the photodetector diode 62 and the reference diode 64. The upper and lower electrical contacts of adjacent devices are separated by the grooves 98. Because the substrate 11 is semi-insulating, the laser diode 60, the photodetector diode 62 and the reference diode 64 are electrically isolated from one another.

The monitoring circuit shown in FIG. 4 is similar to the monitoring circuit shown in FIG. 2, except that the laser diode 60 is forward biased between a positive supply voltage and ground while the photodetector diode 62 and the reference diode 64 are reverse biased between the same positive supply voltage and inverting inputs of the amplifiers 66, 67 which are at a potential close to ground. Such connections are possible because the laser diode 60, the photodetector diode 62 and the reference diode 64 of the structure shown in FIG. 3c have no common electrical contacts.

Figure 5:
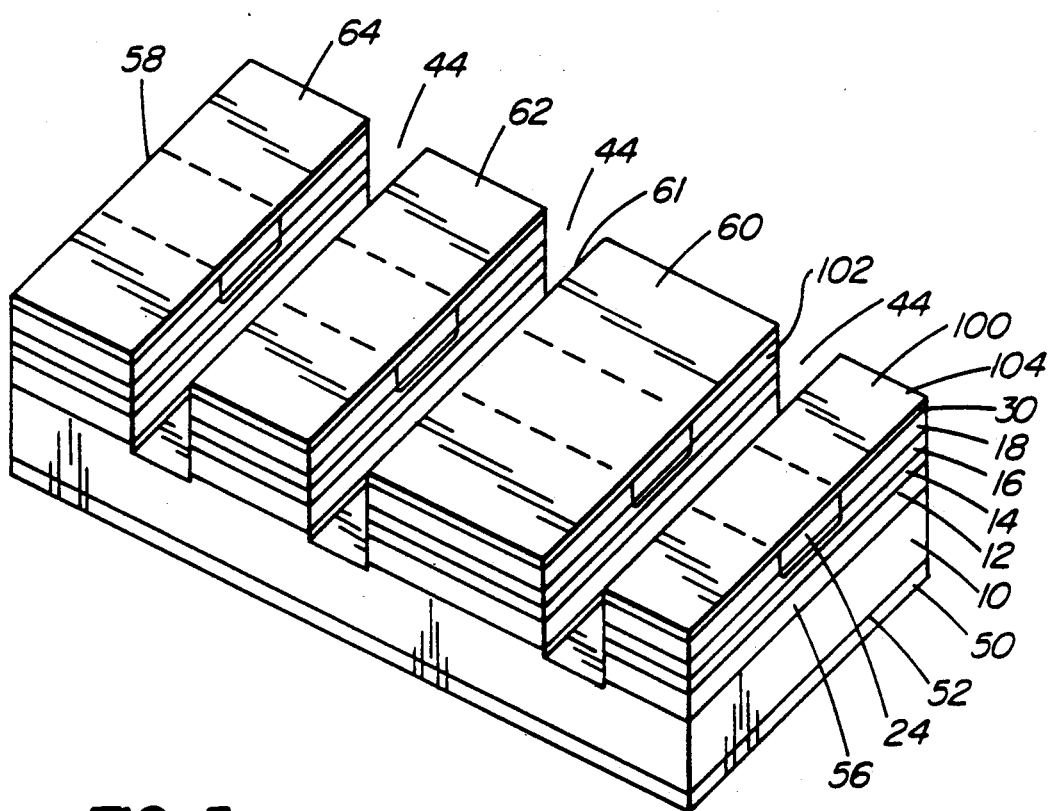
FIG. 5 is a perspective view of another monolithically integrated structure.

The integrated structures shown in FIGS. 1c and 3c both require electronics which can modulate relatively large currents at high speed for modulation of the laser diode 60. FIG. 5 shows another integrated structure which includes a modulator diode 100 which is monolithically integrated onto the same substrate 10 as the laser diode 60, the photodetector diode 62 and the reference diode 64. The modulator diode 100 comprises a series of epitaxial semiconductor layers 12, 14, 16, 18 which are identical to the epitaxial semiconductor layers of the laser diode 60, photodetector diode 62 and reference diode 64. The modulator diode 100 is separated from the laser diode 60 by an additional groove 44 which defines a front facet 102 of the laser diode 60 and is optically coupled to the laser diode 60. The modulator diode 100 has a distinct upper electrical contact 104 and shares a lower electrical contact 50 which is common to the laser diode 60, the photodetector diode 62 and the reference diode 64.

In operation, a DC forward bias is applied to the laser diode 60 and a reverse bias is applied to the modulator diode 100 via the contacts 104, 50. The reverse bias is modulated to modulate the optical absorbancy of the modulator diode 100. Provision of the modulator diode 100 permits DC operation of the laser diode 60, simplifying the laser diode control electronics. Moreover, the high speed electronics which are required to control the modulator need only modulate currents which are lower than the relatively high currents which must be modulated by the laser control electronics required for the integrated structures shown in FIGS. 1c and 3c. Consequently, provision of the modulator diode 100 also permits simplification of the high speed modulation electronics.

The integrated structure shown in FIG. 5 is made as described above for the integrated structure shown in FIG. 1c, except that an additional groove 44 is etched through the semiconductor layers 12, 14, 16, 18 to define the modulator diode 100.

The integrated structure shown in FIG. 3c can also be extended by the addition of a modulator diode.

In the fabrication methods described above, each of the semiconductor layers 12, 14, 16, 18 may be grown by any suitable epitaxial growth method such as Liquid Phase Epitaxy (LPE), Metallorganic Chemical Vapour Deposition (MOCVD) or Molecular Beam Epitaxy (MBE). Growth of the n-type confining layer 12 may be preceded by growth of an n-type GaAs buffer layer. While the invention is illustrated by embodiments based on planar GaAs/AlGaAs stripe lasers, other semiconductor laser structures and other semiconductor materials systems could be used without departing from the invention. A monocrystalline insulating substrate which is compatible with the epitaxial semiconductor layers 12, 14, 16, 18 could be used instead of a semi-insulating substrate in the embodiment illustrated in FIGS. 3a-3c. These and other modifications of the embodiments described above are within the scope of the invention claimed below.

I claim:

1. A monolithically integrated structure comprising a laser diode, a photodetector diode and a reference diode monolithically integrated on a common substrate, the photodetector diode being optically coupled to the laser diode, and the reference diode being substantially identical to the photodetector diode and optically decoupled from the laser diode.

2. A structure as defined in claim 1, wherein each of the laser diode, the photodetector diode and the reference diode comprises an identical series of epitaxial semiconductor layers, and the laser diode, the photodetector diode and the reference diode are separated by grooves which extend through the epitaxial layers to the substrate.

3. A structure as defined in claim 2, wherein a groove which separates the laser diode from the photodetector diode defines a back facet of the laser diode.

4. A structure as defined in claim 1, wherein the substrate is a semiconducting substrate, and the laser diode, the photodetector diode and the reference diode have a common electrical contact to the substrate.

5. A structure as defined in claim 1, wherein the substrate is a semi-insulating substrate, and the laser diode, the photodetector diode and the reference diode are electrically isolated from one another.

6. A structure as defined in claim 5, wherein the substrate is a monocrystalline insulating substrate, and the laser diode, the photodetector diode and the reference diode are electrically isolated from one another.

7. A monolithically integrated structure as defined in claim 1, further comprising a modulator diode integrated on the common substrate, the modulator diode being optically coupled to the laser diode.

8. A structure as defined in claim 7, wherein each of the laser diode, the photodetector diode, the reference diode and the modulator diode comprises an identical series of epitaxial semiconductor layers, and the laser diode, the photodetector diode, the reference diode and the modulator diode are separated by grooves which extend through the epitaxial layers to the substrate.

9. A structure as defined in claim 8, wherein a groove which separates the laser diode from the photodetector diode defines a back facet of the laser diode, and a groove which separates the laser diode from the modulator diode defines a front facet of the laser diode.

10. A method for making a monolithically integrated structure comprising a laser diode, a photodetector diode and a reference diode which are monolithically integrated on a common substrate, the method comprising:

forming a plurality of epitaxial semiconductor layers on a substrate;
forming grooves which extend through the epitaxial substrate to separate the epitaxial layers into a laser diode, a photodetector diode and a reference diode; and
forming electrical contacts to the laser diode, the photodetector diode and the reference diode.

11. A method as defined in claim 10, comprising forming the grooves by reactive ion etching.

12. A method as defined in claim 10, wherein the step of forming electrical contacts comprises forming electrical contacts to an uppermost of the epitaxial layers to define one contact of the laser diode, the photodetector diode and the reference diode, and forming a common electrical contact to the substrate.

13. A method as defined in claim 10, wherein the step of forming electrical contacts comprises rorming electrical contacts to an uppermost of the epitaxial layers to define one contact of the laser diode, the photodetector diode and the reference diode, and forming electrical contacts to a lowermost of the epitaxial layers to define another contact of the laser diode, the photodetector diode and the reference diode.

14. A method as defined in claim 13, comprising forming a common electrical contact to the uppermost of the epitaxial layers and a common electrical contact to the lowermost of the epitaxial layers before forming the grooves, formation of the grooves separating electrical contacts to the laser diode, the photodetector diode and the reference diode.

15. A method for monitoring the performance of a laser diode having a monolithically integrated photodetector diode optically coupled thereto and a monolithically integrated reference diode optically decoupled therefrom, the method comprising:
applying substantially the same reverse bias to the photodetector diode and the reference diode;
detecting a first current in the photodetector diode, said first current being the sum of a photocurrent and a leakage current;
detecting a second current in the reference diode, said second current being a leakage current; and
subtracting a signal proportional to the second current from a signal proportional to the first current to derive a signal proportional to the photocurrent.

* * * * *